United States Patent
Edelstein

(10) Patent No.: US 6,894,498 B2
(45) Date of Patent: May 17, 2005

(54) ACTIVE VIBRATION COMPENSATION FOR MRI GRADIENT COIL SUPPORT TO REDUCE ACOUSTIC NOISE IN MRI SCANNERS

(75) Inventor: William A. Edelstein, Schenectady, NY (US)

(73) Assignee: MRScience LLC, Schenectady, NY (US)

( * ) Notice: Subject to any disclaimer, the term of this patent is extended or adjusted under 35 U.S.C. 154(b) by 68 days.

(21) Appl. No.: 10/799,288

(22) Filed: Mar. 12, 2004

(65) Prior Publication Data

US 2004/0178792 A1 Sep. 16, 2004

Related U.S. Application Data

(60) Provisional application No. 60/453,863, filed on Mar. 12, 2003.

(51) Int. Cl.[7] .................................................. G01V 3/00
(52) U.S. Cl. ....................................... 324/318; 324/322
(58) Field of Search ................................ 324/318, 322, 324/300, 306, 307, 309, 312, 314

(56) References Cited

U.S. PATENT DOCUMENTS

| | | | | |
|---|---|---|---|---|
| 5,617,026 A | * | 4/1997 | Yoshino et al. .............. | 324/318 |
| 6,437,568 B1 | | 8/2002 | Edelstein et al. ............ | 324/318 |
| 6,518,761 B2 | | 2/2003 | Roozen et al. .............. | 324/318 |
| 6,549,010 B2 | | 4/2003 | Roozen et al. .............. | 324/318 |
| 6,552,543 B1 | * | 4/2003 | Dietz ........................... | 324/318 |
| 6,703,836 B2 | * | 3/2004 | Ladebeck et al. ........... | 324/318 |
| 6,774,633 B2 | * | 8/2004 | Wang et al. ................. | 324/318 |

OTHER PUBLICATIONS

"Making MRI Quieter," E.A. Edelstein et al., Magnetic Resonance Imaging, vol. 20 (2002) pp. 155–163.
"Characterization and Prediction of Gradient Acoustic Noise in MR Imagers," R. A. Hedeen et al., Magnetic Resonance in Medicine, vol. 37 (1997) pp. 7–10.
"Active–Passive Gradient Shielding for MRI Acoustic Noise Reduction," W. A. Edelstein et al., Abstract 2325 Submitted for 2004 ISMRM Meeting, Kyoto.

* cited by examiner

*Primary Examiner*—Louis Arana

(57) ABSTRACT

The present invention provides an apparatus for reducing acoustic noise in a magnetic resonance imaging device including a suspension element including at least one resilient element and an active drivable element for applying a compensating force to reduce vibration transmission. The active drivable element is positioned so as to not directly support the weight of the gradient coil assembly, which avoids applying strong forces to relatively fragile active drivable elements, such as piezoelectric force transducers. Force signals for the active drivable element are derived in a feed-forward manner from the applied gradient waveform or from motion of the gradient coil assembly bracket. Alternatively, the active drivable element can be driven by signals derived from measured vibration or other motion of parts of the MRI magnet, gradient coils or rf coils.

20 Claims, 6 Drawing Sheets

ACTIVE VIBRATION COMPENSATION FOR MRI GRADIENT COIL SUPPORT TO REDUCE ACOUSTIC NOISE IN MRI SCANNERS

This application claims the benefit of U.S. Provisional Application No. 60/453,863, filed Mar. 12, 2003.

BACKGROUND OF THE INVENTION

The present invention relates generally to a magnetic resonance imaging (MRI) scanner and more particularly to a low acoustic noise MRI scanner.

MRI scanners, which are used in various fields such as medical diagnostics, typically create images based on the operation of a magnet, a gradient coil assembly, and a radiofrequency coil(s). The magnet creates a uniform main magnetic field that makes unpaired nuclear spins, such as hydrogen atomic nuclei, responsive to radiofrequency excitation via the process of nuclear magnetic resonance (NMR). The gradient coil assembly imposes a series of pulsed, spatial-gradient magnetic fields upon the main magnetic field to give each point in the imaging volume a spatial identity corresponding to its unique set of magnetic fields during an imaging pulse sequence. The radiofrequency coil applies an excitation rf (radiofrequency) pulse that temporarily creates an oscillating transverse nuclear magnetization in the sample. This sample magnetization is then detected by the excitation rf coil or other rf coils. The resulting electrical signals are used by the computer to create magnetic resonance images. Typically, there is a radiofrequency coil and a gradient coil assembly within the magnet.

Magnets for MRI scanners include superconductive-coil magnets, resistive-coil magnets, and permanent magnets. Known superconductive magnet designs include cylindrical magnets and open magnets. Cylindrical magnets typically have an axially-directed static magnetic field. In MRI systems based on cylindrical magnets, the radiofrequency coil, the gradient coil assembly and the magnet are generally annularly-cylindrically shaped and are generally coaxially aligned, wherein the gradient coil assembly circumferentially surrounds the radiofrequency coil and wherein the magnet circumferentially surrounds the gradient coil assembly. Open magnets typically employ two spaced-apart magnetic assemblies (magnet poles) with the imaging subject inserted into the space between the assemblies. This scanner geometry allows access by medical personnel for surgery or other medical procedures during MRI imaging. The open space also helps the patient overcome feelings of claustrophobia that may be experienced in a cylindrical magnet design.

A gradient coil assembly comprises a set of windings that produce the desired gradient fields. Such an assembly for a human-size whole-body MRI scanner typically weighs about 1000 kg. The windings consist of wires or conductors formed by cutting or etching sheets of conducting material (e.g. copper) to form current paths to generate desired field patterns. The wires or conducting coils or plates are themselves typically held in place by fiberglass overwindings plus epoxy resin.

Generally, the various components of the MRI scanner represent sources and pathways of acoustic noise that can be objectionable to the patient being imaged and to the operator of the scanner. For example, the gradient coil assembly generates loud acoustic noises, which many medical patients find objectionable. The acoustic noises occur in the imaging region of the scanner as well as outside of the scanner. Known passive noise control techniques include locating the gradient coil assembly in a vacuum enclosure.

Large pulsed electrical currents, typically 200 A or more, with risetimes and durations typically in the submillisecond to millisecond range, are applied to the windings. Because these windings are located in strong static magnetic fields (e.g., 1.5 T for a typical clinical imager to much higher values for research systems), the currents interact with the static field and strong Lorentz forces are exerted on different parts of the gradient coil assembly. These forces in turn compress, expand, bend or otherwise distort the gradient coil assembly. It will be readily understood by those skilled in the art that the frequencies of the acoustic noise so generated will be in the audio range. Typically there are strong components of noise from 50 Hz and below to several kHz at the upper end of the frequency range.

Vibrations can be conveyed mechanically from the gradient coil assembly to the patient area, the cryostat or other external parts of the MRI scanner via the gradient coil assembly support frame. These transmitted vibrations can cause the external parts to vibrate and thereby produce acoustic noise, which will be heard by the MRI subject and the MRI operator.

One way to decrease the transmitted vibrations is to use a passive vibration isolation mounts for the gradient coil assembly. It is known in the mechanical arts area to design and use isolation mounts so that vibrations from machinery supported by the isolation mounts are not transmitted to surrounding structure that supports the isolation mounts. Conventional isolation mounts include those of the elastomeric type and those of the spring type. Such isolation mounts are designed such that the natural frequency of vibration of the mounts and the machinery is less than the important excitation frequencies of the machinery in order to provide effective vibration isolation.

In one approach to providing a vibration isolation mount, solid metal brackets are mounted on the gradient coil assembly and corresponding solid metal brackets are attached to the cryostat. The gradient coil assembly is positioned so that the brackets are aligned and elastomeric pads (for example, rubber) are positioned between each cryostat bracket and the corresponding gradient coil assembly bracket. With this configuration, the transmission of vibration from the gradient coil assembly to the cryostat is attenuated by the elastomeric pads.

Unfortunately, there is a limit to the degree of passive attenuation achievable by use of elastomeric pads or spring isolation mounts as described. Generally speaking, softer pads or springs produce greater attenuation. However, the pads or springs underneath the gradient coil assembly must be able to support the gradient coil assembly weight. Also, pads or springs that are too soft might permit excessive motion of the gradient coil assembly in response to Lorentz forces, in which case image quality could be adversely affected. Pad or spring stiffness is thus a tradeoff between keeping the gradient coil assembly precisely positioned, on the one hand, and attenuating vibration transmission on the other.

In another approach active vibration compensation is used to substantially improve the vibration isolation efficacy as described above. One example of this approach is disclosed in Roozen et al., U.S. Pat. No. 6,549,010, 2003. FIG. 1 is a reproduction of part of this device, and shows a gradient carrier 18 supported by suspension elements 19 including a resilient element 22 and an active drivable element 21 connected in series with suspension element 22. If forces cause a displacement of gradient carrier 18, then drivable element 21 can be lengthened or contracted to counteract the displacement and thereby prevent any force being applied to suspension element 22. Unfortunately, with this arrangement, active element 21 must be able to withstand the entire weight of the gradient carrier, which may be hundreds of pounds. Roozen et al. describe drivable element 21 as a piezo actuator. However, such actuators are fragile and could fracture in this configuration.

These approaches to reduce acoustic noise due to the various components in MRI scanners have been partially effective, but patients and technicians still find the noise in and about a MRI scanner to be problematic. What is needed is a lower noise MRI scanner that addresses the multiple sources and pathways of acoustic noise in and about the scanner.

SUMMARY OF THE INVENTION

The present invention provides an apparatus for reducing acoustic noise in a magnetic resonance imaging device including a suspension element including at least one resilient element and an active drivable element for applying a compensating force to reduce vibration transmission. The active drivable element is positioned so as to not directly support the weight of the gradient coil assembly, which avoids applying strong forces to relatively fragile active drivable elements, such as piezoelectric force transducers. Force signals for the active drivable element are derived in a feed-forward manner from the applied gradient waveform or from motion of the gradient coil assembly bracket. Alternatively, the active drivable element can be driven by signals derived from measured vibration or other motion of parts of the MRI magnet, gradient coils or rf coils.

A first aspect of the invention is directed to an apparatus for reducing acoustic noise in a magnetic resonance imaging (MRI) device, the apparatus comprising: a gradient coil assembly of the MRI device coupled to a frame of the MRI device by suspension elements to reduce acoustic noise due to vibration transmission, each suspension element including at least one resilient element and an active drivable element for applying a compensating force to reduce vibration transmission, wherein the active drivable element is positioned so as to not directly support the weight of the gradient coil assembly.

A second aspect of the invention is directed to a method for reducing acoustic noise due to vibration transmission from a gradient coil assembly to a frame of a magnetic resonance imaging device, the method comprising the steps of: supporting a support portion of the gradient coil system relative to the frame using a resilient element; and actively compensating for vibrations of the gradient coil assembly by applying a force, via an active drivable element, from a point not between the support portion and the frame.

A third aspect of the invention is directed to an apparatus for reducing acoustic noise due to vibration transmission from a gradient coil assembly to a frame of a magnetic resonance imaging device, the apparatus comprising: means for resiliently supporting a support portion of the gradient coil system relative to the frame; and means for actively compensating for vibrations of the gradient coil assembly by applying a force from a point not between the support portion and the frame.

A fourth aspect of the invention is directed to a suspension element for reducing acoustic noise due to vibration transmission from a gradient coil assembly to a frame of a magnetic resonance imaging device, the apparatus comprising: a C-fixture including a first support for applying forces to a support portion of the frame and a second support aligned with the first support and immovable relative thereto; a first resilient element for supporting a support portion of the gradient coil assembly on the support portion of the frame; and an active drivable element positioned between a second resilient element and the second support and configured to apply a force to reduce vibration transmission.

The foregoing and other features of the invention will be apparent from the following more particular description of embodiments of the invention.

BRIEF DESCRIPTION OF THE DRAWINGS

The features and advantages of the present invention will become apparent from the following detailed description of the invention when read with the accompanying drawings in which.

DETAILED DESCRIPTION OF INVENTION

Figure 1:
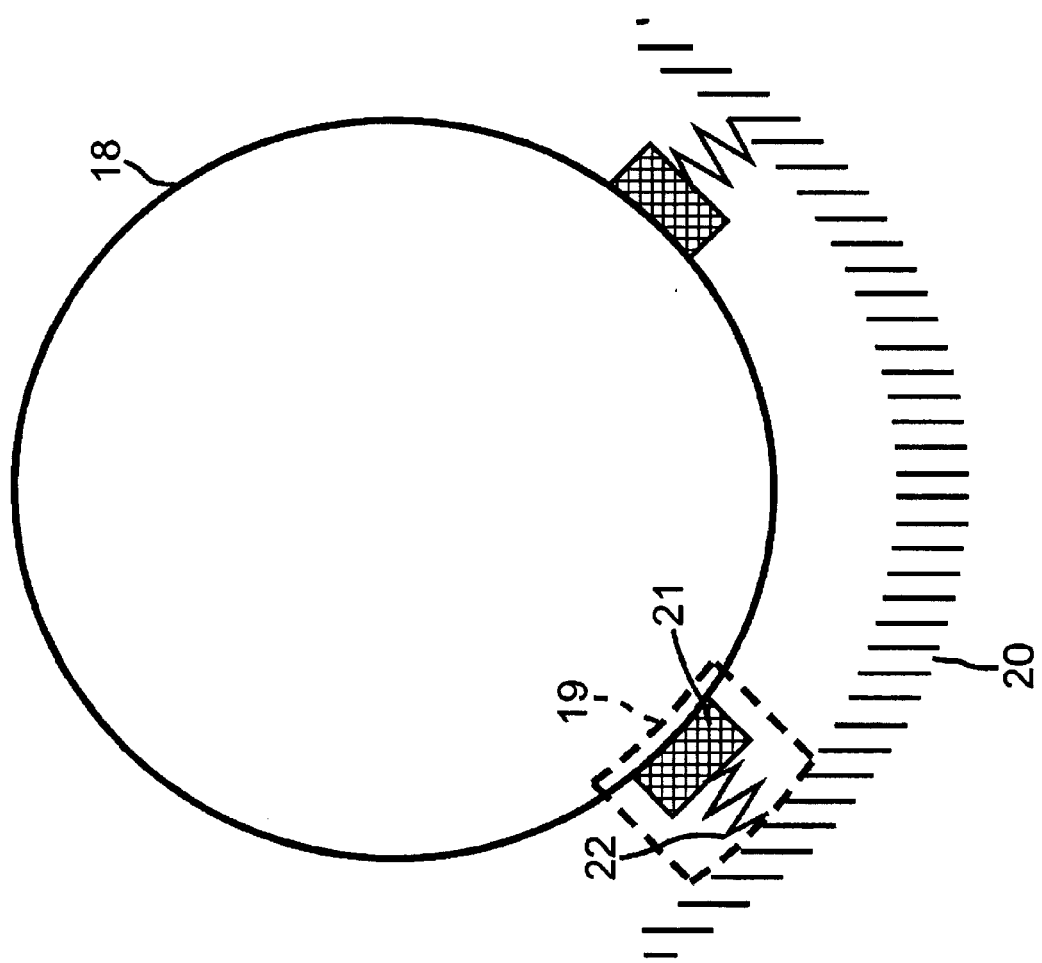
FIG. 1 is a cross-sectional end view of a prior art gradient carrier and active control support structure.
Figure 2:
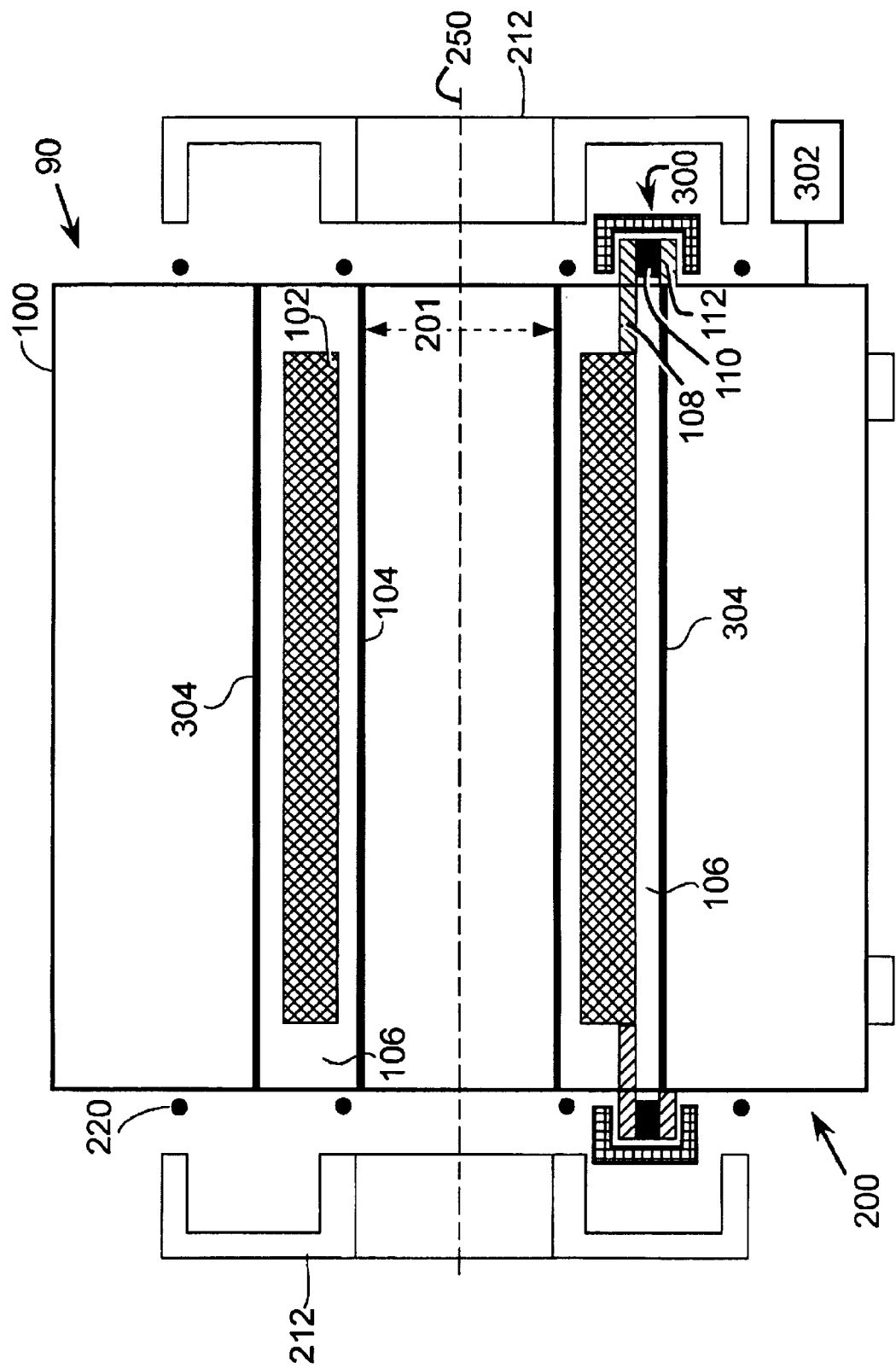
FIG. 2 is a cross-sectional side view of an entire magnetic resonance imaging (MRI) device showing magnet, patient handling system and gradient coil assembly according to the invention.

Referring to FIG. 2 there is shown an illustrative MRI device 90 to which embodiments of the present invention are applicable. MRI device 90 is of a type useful in producing magnetic resonance (MR) images of a patient or subject. Throughout the figures, like numerals represent like elements. FIGS. 2–6 show MRI device 90 based on a closed, cylindrical superconducting magnet assembly 200. It is to be appreciated by one skilled in the art that the functions and descriptions of the present invention are equally applicable to an open magnet configuration.

Referring to FIG. 2, this type of magnet assembly comprises an inner surface referred to as a magnet warm bore 304 and a cryostat shell 100 disposed radially around the outer surface. The magnet assembly further comprises end cap seals 212. When end cap seals 212 are secured against rubber gaskets 220 positioned between end cap seals 212 and cryostat shell 100, and secured against other rubber gaskets 220 positioned between end cap seals 212 and patient tube 106, an airtight space containing the gradient coil assembly 102 is created.

Typically, cryostat shell 100 encloses a superconductive magnet (not shown) that, as is well-known, includes several radially-aligned and longitudinally spaced-apart superconductive coils, each capable of carrying a large electric current. The superconductive coils produce a homogeneous, main static magnetic field, known as $B_0$, typically in the range from 0.5 T to 8 T, aligned along the center axis 250. Cryostat shell 100 is generally metallic, typically steel or stainless steel.

A patient or imaging subject (not shown) is positioned within a cylindrical imaging volume 201 surrounded by patient bore tube 104. Bore tube 104 is typically made of electrically conducting material such as stainless steel. Gradient coil assembly 102 is disposed around in a spaced apart coaxial relationship therewith and generates time-dependent gradient magnetic field pulses in a known manner. Radially disposed around gradient coil assembly 102 is cryostat shell 100 including warm bore 304. Cryostat shell 100 contains the magnet that produces the static magnetic field necessary for producing MRI images, as described above.

Also shown in FIG. 2 is a schematic view of an active vibration isolation suspension element 300 that reduces vibration transmission from gradient coil assembly 102 to fixed cryostat frame 100. Suspension 300 is positioned about or adjacent to gradient coil assembly rigid support portion 108 and cryostat shell 100 rigid support portion 112. Each support portion 108 and 112 extends from its respective component. In one embodiment, each support portion 108, 112 is a mounting bracket that is coupled to their respective components. However, each support portion 108, 112 may be formed as an integral part of their respective portions or provided in any other fashion that provides adequate support. Suspension element 300 does not support the weight of gradient coil assembly 102.

In this configuration, cryostat shell 100 serves as a supporting frame for the gradient coil assembly 102. Other configurations considered in this specification are separate structures mounted on the floor, which serve as supporting frames for the gradient coil assembly 102. We will refer to any of these supporting structures as a "frame."

Figure 3:
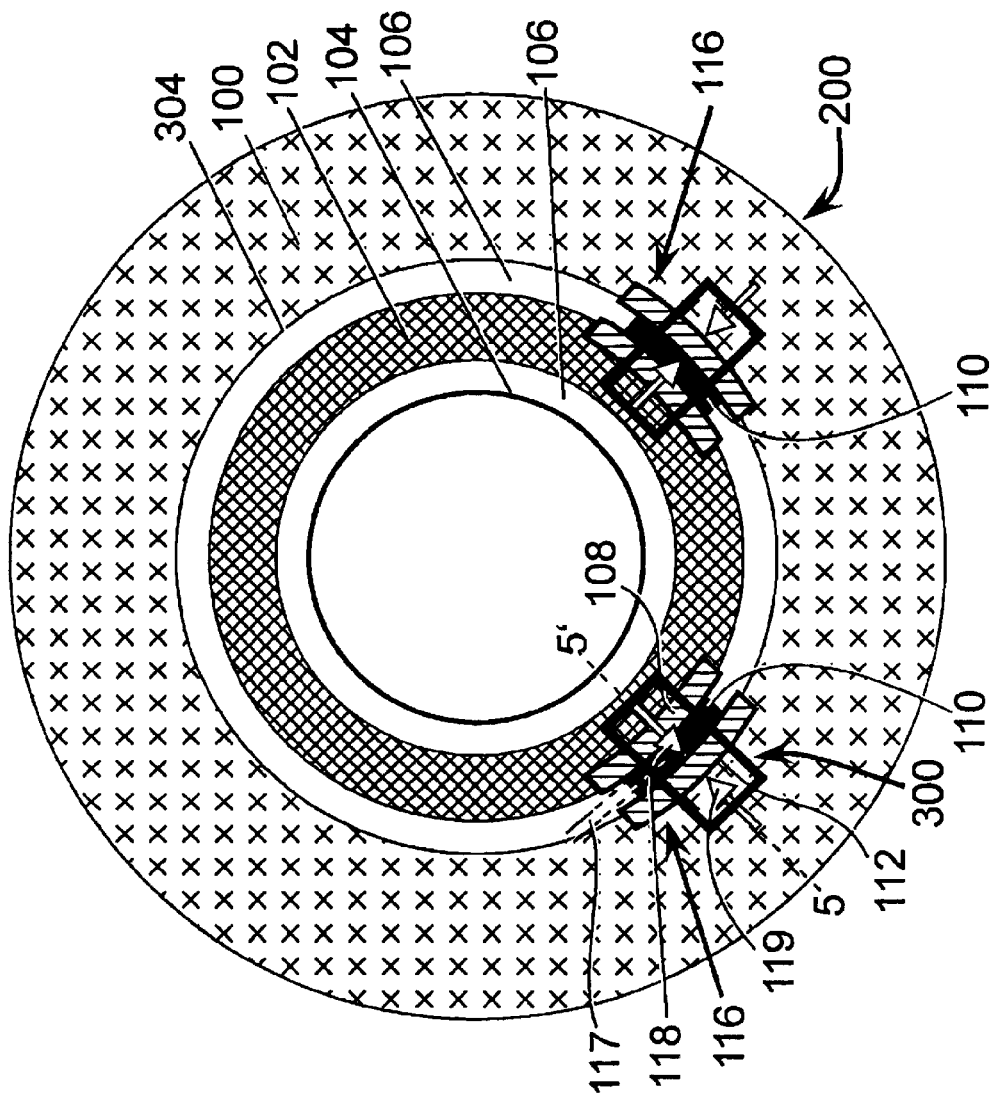
FIG. 3 is a schematic cross-sectional end view of an MRI device with vibration cancellation based on FIG. 2.

Referring to FIG. 3, a cross-sectional end view of the magnet arrangement in FIG. 2 is shown with end caps 212 removed. FIG. 3 also shows a back view of suspension elements 300 with their interiors cut away to show details of the forces 118 and 119 and passive vibration isolation supports 116. In particular, in one embodiment, two sets of passive vibration isolation supports 116 are positioned near the bottom of gradient coil assembly 102 to support its weight. The transmission from gradient coil assembly 102 to frame 100 depends on the stiffness and damping of the elastomeric pads 110. The excitation of gradient coil assembly 102 by embedded gradient windings has a broad spectrum extending to several kHz. (See R A Hedeen et al. *Magnetic Resonance in Medicine* 37, 7–10, 1997.) This excitation has the effect of bending or compressing the bulk of the gradient coil assembly 102. The surface of gradient coil assembly 102 undergoes microscopic motion that acts through elastomeric pads 110 to apply force to frame 100. The amplitude of gradient coil rigid support portion 108 displacement δx 117 is typically a few microns. Some force F 118 will then be applied along line 5–5' via the elastomeric pads 110 to frame support portion 112, namely, F=k δx, where k is the spring constant of elastomeric pad 110. A compensating force $F_c$ 119 of amplitude $F_c=-k\,\delta x$ applied to frame support portion 112 will result in no net force on and no vibration of the frame support portion 112, and no consequent induced vibration of frame 100.

Figure 4:
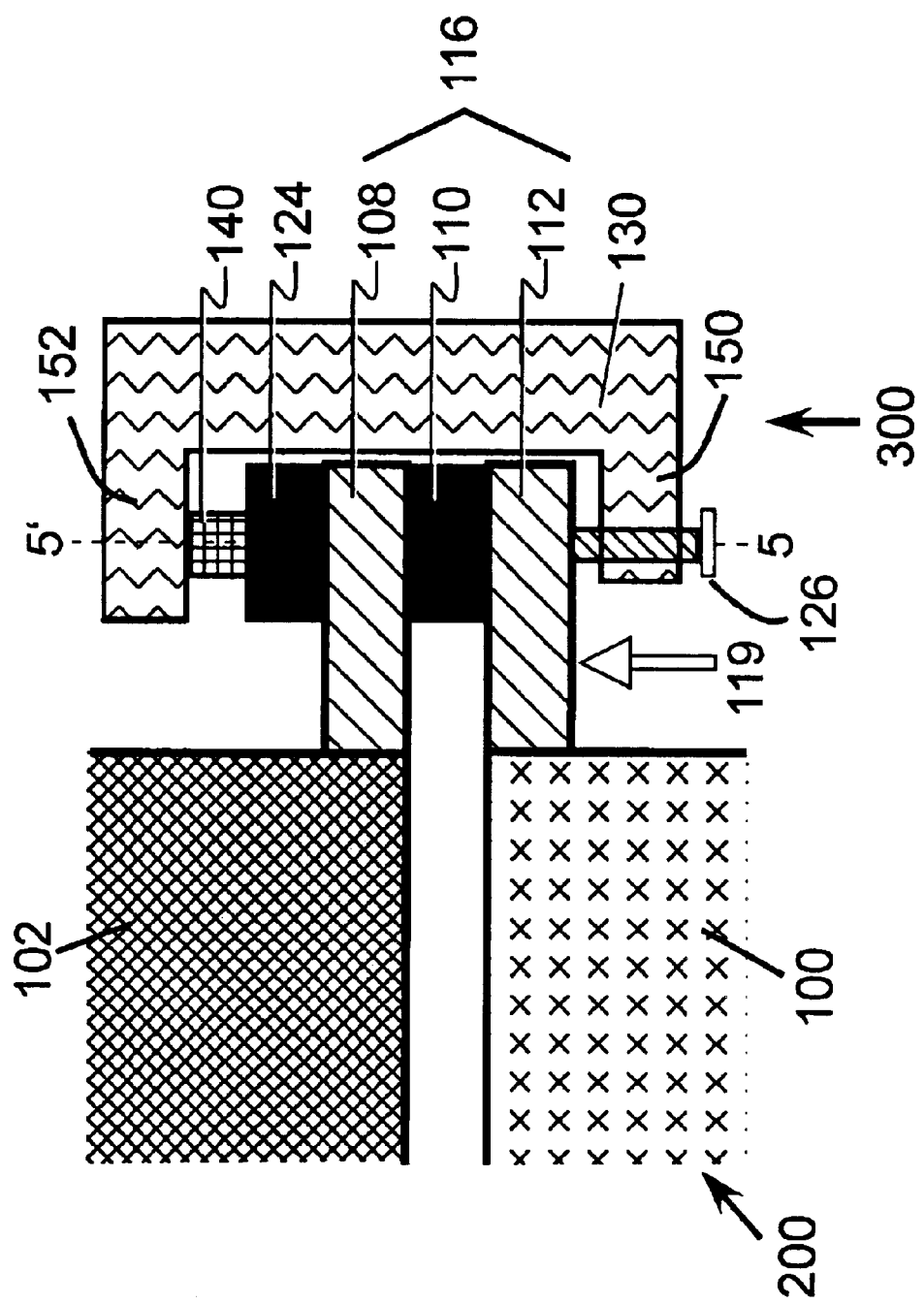
FIG. 4 is a schematic cross-sectional view of a detailed force cancellation fixture including an active drivable element.

FIG. 4 is a more detailed cross-sectional view of the suspension elements 300 that apply the compensating force described above. Each suspension element 300 includes at least one resilient element 110, 124 and an active drivable element 140 for applying the compensating force, described above, to reduce vibration transmission. Active drivable element 140 is positioned so as not to directly support the weight of gradient coil assembly 102. In other words, active drivable element 140 is positioned to apply a force from a point not between the support portion 108 of gradient coil assembly 102 and frame 100. In one embodiment, each suspension 300 includes a first support 150 for supporting frame support portion 112, a second support 152 aligned with first support 150 and immovable relative thereto, a first resilient element 110 for supporting support portion 108 of gradient coil assembly 102 on support portion 112 of frame 100. In one embodiment, shown in FIGS. 4 and 6, first support 150 and second support 152 are coupled to one another to form a C-shaped fixture (C-fixture) 130. Each suspension element 300 may also include an adjustable pre-stressing mount 126 for adjusting the position of first support 150 relative to support portion 112 of frame 100. Gradient coil assembly rigid support portion 108 is attached to or integral with gradient coil assembly 102, and the cryostat rigid support portion 112 is attached to or integral with frame (cryostat shell) 100. Each resilient element 110, 124 may include: at least one elastomeric pad and/or at least one spring.

Continuing with FIG. 4, active drivable element 140 (sometimes referred to as a "force transducer") provides a compensating force as described above in order to substantially decrease vibration transmission from gradient coil assembly 102 to cryostat shell (frame) 100. In one embodiment, a second resilient element 124 provides additional vibration isolation so that the suspension element 300 does not inadvertently bypass and vitiate the isolation provided by first resilient element 110. The additional resilient element 124 may not be necessary if the suspension element 300 operates optimally. In one embodiment, active drivable element 140 may be, for example, at least one of a piezoelectric actuator, a magnetic actuator and a hydraulic actuator. Adjustable pre-stressing mount 126 (e.g. a bolt, screw or threaded rod) enables the pre-stressing of the suspension element 300 in order to enable negative as well as positive forces to be applied between the gradient coil rigid support portion 108 and the cryostat rigid support portion 112.

In order to illustrate the operation of this arrangement, assume that the gradient coil assembly support portion 108 is experiencing a displacement downward. Then a downward force will be applied along axis 5–5', via resilient elements 124 and 110, to frame support portion 112, tending to push support portion 112 downward. Given suspension element 300, a relative force applied to squeeze gradient coil assembly support portion 108 and frame support portion 112 together will tend to counter the force. The magnitude of the squeezing force applied by transducer 140 can, in principle, be adjusted so that there is no net force on support portion 112. The squeezing force described above will tend to produce motion of the gradient coil support portion 108 in the same direction as the original vibration and thereby increase gradient coil assembly 102 motion. However, the amplitude of that additional displacement will be about the same as the original motion. This is not a problem for MR imaging as long as the original motion is microns. The magnitude of the additional gradient coil support portion 108 motion produced by active drivable element 140 can be seen from a simple argument. The force $F_c$ 119 applied to stop frame support portion 112 motion is $F_c=-k\,\delta x$, where δx 117 is the original gradient coil assembly support portion 108 displacement. Assuming that frame support portion 112 does not move significantly, the motion of the gradient coil assembly support portion 108 caused by this force is $\delta x'=-F_c/k$, which is the same as δx. So the amplitude of motion of the gradient coil support portion 108 may double. (Note, support portion 112 motion even with passive vibration isolation is much smaller than the gradient coil assembly 102 motion—30 dB as measured in W A Edelstein et al., *Magnetic Resonance Imaging* 20, 155–163, 2002. It is this motion, that the present invention reduces further.)

The forces involved can be quantified. In one example, resilient member 110 may be made of rubber elastomer that is compressed about 1 cm by half the weight of the gradient coil assembly 102 (500 kg, 4900 N), which gives a spring constant of $k=4.9 \times 10^5$ N/m. 10 $\mu$m of motion of the gradient coil rigid support portion 108 gives a force of only $10\mu \cdot k = 4.9$ N=1.1 lbf. Given that frame support portion 112 has to be very stiff to support gradient coil assembly 102 weight, this implies that the motion of the cryostat rigid support portion 112 is small. This is consistent with the vibration amplitude attenuation of 30 dB between gradient support portion 108 and frame support portion 112 found in W A Edelstein et al., *Magnetic Resonance Imaging* 20, 155–163, 2002.

The compensating force is preferably applied in a "feed forward" fashion based on a predetermined, electrical-signal-to-gradient assembly motion transfer function. One way to determine such a transfer function is to measure the motion of gradient support portion 108 and/or frame support portion 112 when a pulsed gradient signal is applied to a single axis. This transfer function would then be embodied as a processor 302 including a hardware and/or software signal filter which would then apply the correct time-dependent force via active drivable element 140 between gradient support portion 108 and frame support portion 112 to counteract the force applied to frame support portion 112 by motion of gradient support portion 108. Transfer functions for other axes would be similarly obtained, and the results combined independently to reduce frame support portion 112 motion and consequent acoustic noise production. Using additional relative force fixtures similar to suspension element 300, this process could also be applied to sideways motion or longitudinal motion along axis 250 of gradient coil assembly 102.

The signal for the force compensation can be derived in other ways than feed forward from the input gradient pulse as described above. The signal could be obtained by sensing the motion of gradient support portion 108 and feeding forward, that is, deriving a transfer function, to apply to active drivable element 140. In one embodiment, the signal could be derived from feedback from at least one of gradient coil assembly 102 and cryostat shell (frame) 100. In this case, processor 302 configured to activate active drivable element 140 based on the feedback could be implemented to bring the motion of frame support portion 112 to zero.

Figure 5:
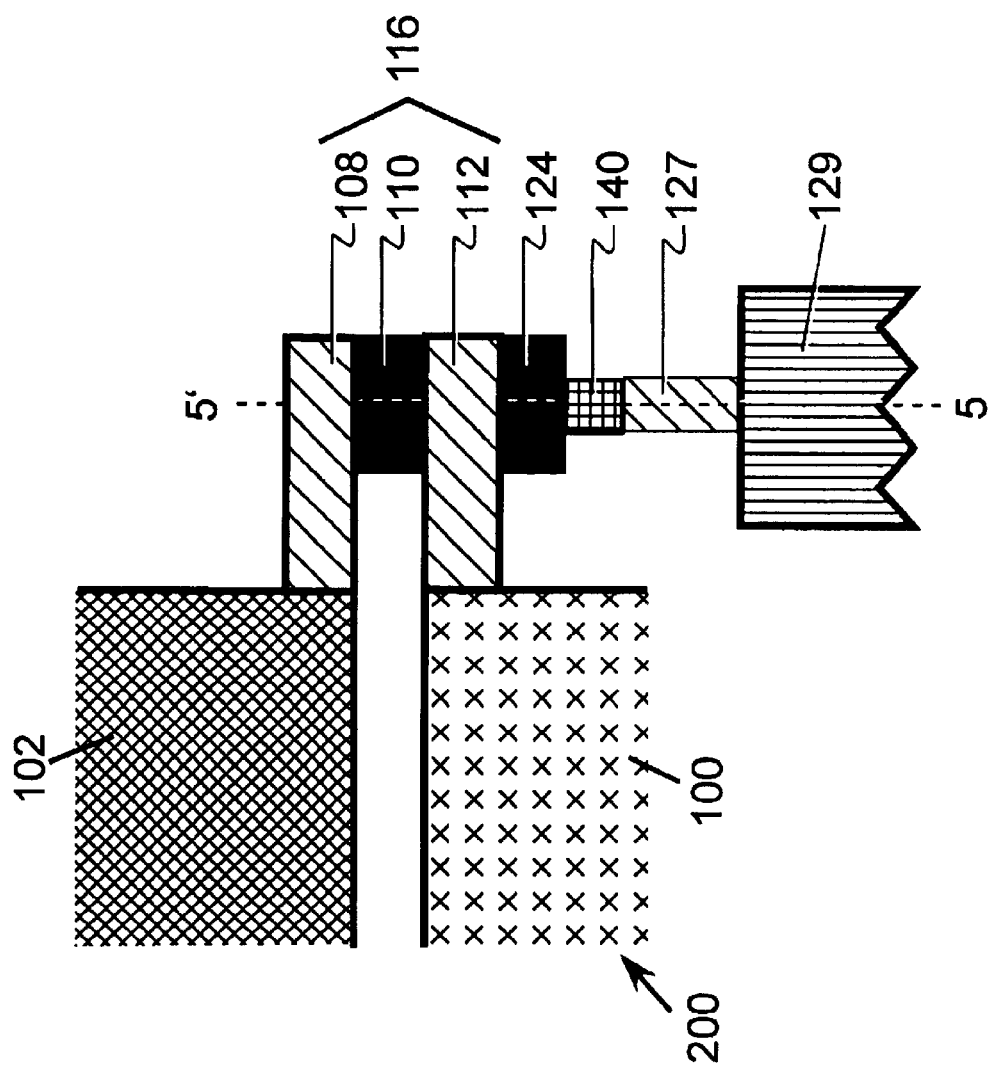
FIG. 5 is a schematic cross-sectional view of a detailed force cancellation fixture where the force cancellation fixture is supported by a floor.

FIG. 5 shows a further configuration for decreasing induced vibration of frame 100. In this embodiment, gradient coil assembly 102 is still supported by the fixed cryostat shell or frame 100 via passive vibration isolation support 116. However, an active drivable element 140 is supported from the floor via floor pedestal 129, and active drivable element 140 has its position adjusted by using pre-stressing mount 127 (e.g. a bolt, screw or threaded rod) to apply pre-stress to active drivable element 140.

Figure 6:
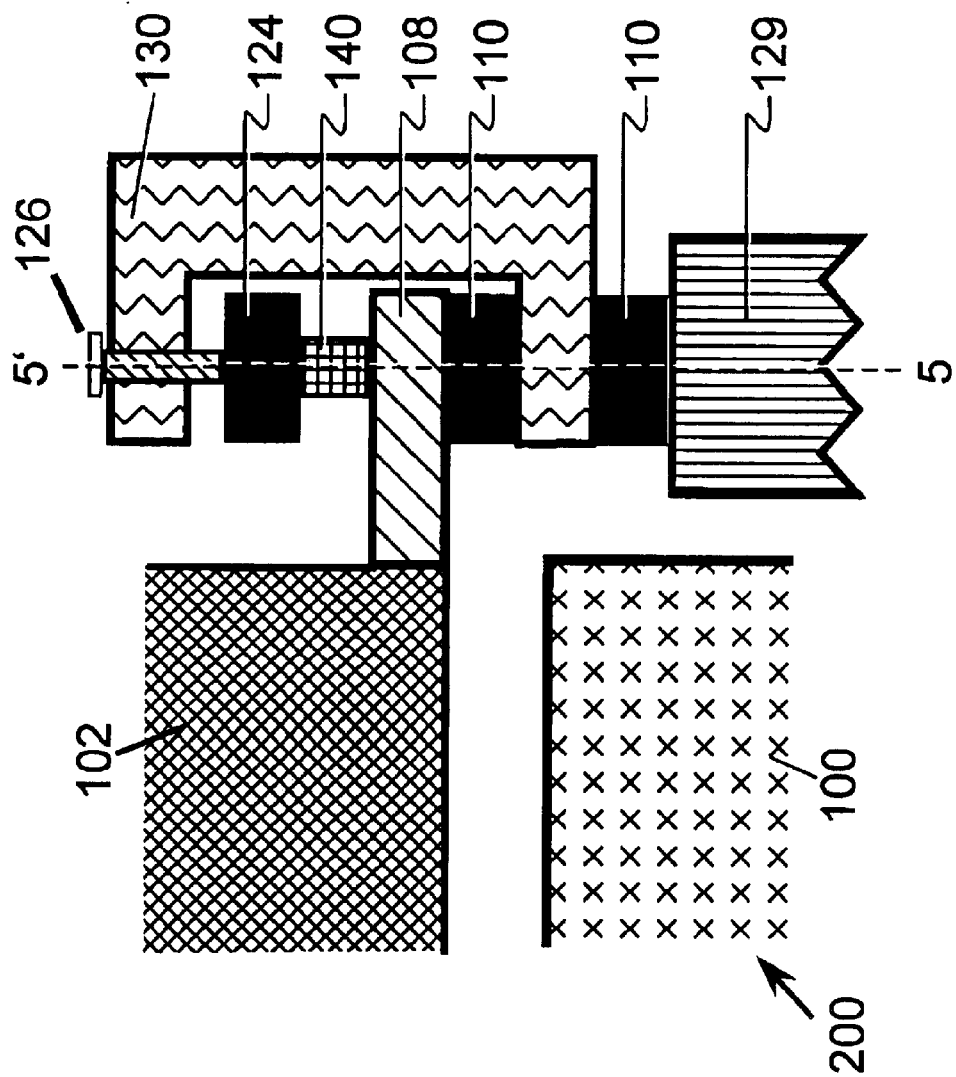
FIG. 6 is a schematic cross-sectional view of a force cancellation fixture where the gradient coil assembly is supported from a floor.

FIG. 6 shows a further configuration for decreasing induced vibration of frame 100. In this embodiment, gradient coil assembly 102 is supported by floor pedestal 129. A C-fixture 130 is positioned so that active drivable element 140 does not support the weight of gradient coil assembly 102.

In any of the above-described embodiments, more stages of resilient elements and metal could be used between gradient support portion 108 and frame support portion 112 and force compensation could be applied to intermediate metal stages to achieve further vibration isolation. In addition, more or fewer suspension elements 300 with force compensation could be used around the circumference of the ends of gradient coil assembly 102 to provide the desired stability and vibration isolation for gradient coil assembly 102.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An apparatus for reducing acoustic noise in a magnetic resonance imaging (MRI) device, the apparatus comprising:
    a gradient coil assembly of the MRI device coupled to a frame of the MRI device by suspension elements to reduce acoustic noise due to vibration transmission, each suspension element including at least one resilient element and an active drivable element for applying a compensating force to reduce vibration transmission,
    wherein the active drivable element is positioned so as to not directly support the weight of the gradient coil assembly.

2. The apparatus of claim 1, wherein each suspension element includes:
    a first support for applying forces to a support portion of the frame;
    a second support aligned with the first support and immovable relative thereto;
    a first resilient element for supporting a support portion of the gradient coil assembly on the support portion of the frame;
    wherein the active drivable element is positioned between a second resilient element and the second support.

3. The apparatus of claim 2, wherein the first support and the second support are coupled to one another to form a C-fixture.

4. The apparatus of claim 2, further comprising an adjustable pre-stressing mount for adjusting the position of the first support relative to the support portion of the frame, whereby the adjustable pre-stressing mount applies an adjustable pre-stress through the suspension element.

5. The apparatus of claim 1, wherein the support portions of the gradient coil assembly and the frame each include a mounting bracket.

6. The apparatus of claim 1, wherein the resilient element includes at least one of the group consisting of: at least one elastomeric pad and at least one spring.

7. The apparatus of claim 1, further comprising means for activating the active drivable element based on feedback from at least one of the gradient coil assembly and a cryostat shell.

8. The apparatus of claim 1, wherein the means for activating further activates the active drivable element based on a predetermined transfer function.

9. The apparatus of claim 1, wherein the active drivable element includes at least one of a piezoelectric actuator, a magnetic actuator and a hydraulic actuator.

10. A method for reducing acoustic noise due to vibration transmission from a gradient coil assembly to a frame of a magnetic resonance imaging device, the method comprising the steps of:

supporting a support portion of the gradient coil system relative to the frame using a resilient element; and actively compensating for vibrations of the gradient coil assembly by applying a force, via an active drivable element, from a point not between the support portion and the frame.

11. An apparatus for reducing acoustic noise due to vibration transmission from a gradient coil assembly to a frame of a magnetic resonance imaging device, the apparatus comprising:

means for resiliently supporting a support portion of the gradient coil system relative to the frame; and means for actively compensating for vibrations of the gradient coil assembly by applying a force from a point not between the support portion and the frame.

12. The apparatus of claim 11, further comprising means for activating the compensating means based on feedback from at least one of the gradient coil assembly and a cryostat shell.

13. The apparatus of claim 12, wherein the activating means further activates the active drivable element based on a predetermined transfer function.

14. A suspension element for reducing acoustic noise due to vibration transmission from a gradient coil assembly to a frame of a magnetic resonance imaging device, the apparatus comprising:

a C-fixture including a first support for applying forces to a support portion of the frame and a second support aligned with the first support and immovable relative thereto;

a first resilient element for supporting a support portion of the gradient coil assembly on the support portion of the frame; and an active drivable element positioned between a second resilient element and the second support and configured to apply a force to reduce vibration transmission.

15. The suspension element of claim 14, wherein each resilient element includes at least one of the group consisting of: at least one elastomeric pad and at least one spring.

16. The suspension element of claim 14, further comprising means for activating the active drivable element based on feedback from the gradient coil assembly.

17. The suspension element of claim 16, wherein the means for activating further activates the active drivable element based on a predetermined transfer function.

18. The suspension element of claim 14, wherein the active drivable element includes at least one of a piezoelectric actuator, a magnetic actuator and a hydraulic actuator.

19. The suspension element of claim 14, further comprising an adjustable pre-stressing mount for adjusting the position of the first support relative to the support portion of the frame, whereby the adjustable pre-stressing mount applies an adjustable pre-stress through the suspension element.

20. The suspension element of claim 14, wherein the support portions of the gradient coil assembly and the frame each include a mounting bracket.

* * * * *